(12) United States Patent
Shih-Tsung

(10) Patent No.: US 6,940,717 B2
(45) Date of Patent: Sep. 6, 2005

(54) CPU COOLING USING A HEAT PIPE ASSEMBLY

(75) Inventor: Chen Shih-Tsung, Taipei (TW)

(73) Assignee: Shuttle Inc., Taipei (TW)

( * ) Notice: Subject to any disclaimer, the term of this patent is extended or adjusted under 35 U.S.C. 154(b) by 196 days.

(21) Appl. No.: 10/438,182

(22) Filed: May 13, 2003

(65) Prior Publication Data

US 2004/0047126 A1 Mar. 11, 2004

(30) Foreign Application Priority Data

May 13, 2002 (TW) ...................................... 91206737 U

(51) Int. Cl.⁷ ................................................. H05K 7/20
(52) U.S. Cl. ...................... 361/695; 361/687; 361/697; 165/104.33; 165/104.34
(58) Field of Search ................................ 361/683, 679, 361/686, 687, 688–697, 699–714, 717–719; 257/714–726; 307/147, 150; 312/236; 454/184; 165/80.2, 80.3, 185, 104.33, 104.26, 121, 122; 174/15.2, 16.3; 62/259.2

(56) References Cited

U.S. PATENT DOCUMENTS

| | | | | |
|---|---|---|---|---|
| 3,892,273 A | * | 7/1975 | Nelson ................... 165/104.26 |
| 4,394,344 A | * | 7/1983 | Werner et al. ............... 376/146 |
| 5,339,214 A | * | 8/1994 | Nelson ....................... 361/695 |
| 5,495,392 A | | 2/1996 | Shen |
| 5,504,652 A | | 4/1996 | Foster et al. |
| 5,671,118 A | | 9/1997 | Blomquist |
| 5,959,837 A | * | 9/1999 | Yu ............................. 361/697 |
| 6,212,074 B1 | | 4/2001 | Gonsalves et al. |
| 6,223,815 B1 | | 5/2001 | Shibasaki |
| 6,288,895 B1 | * | 9/2001 | Bhatia ........................ 361/687 |
| 6,328,097 B1 | * | 12/2001 | Bookhardt et al. ..... 165/104.33 |
| 6,352,103 B1 | * | 3/2002 | Chu et al. .................. 165/80.3 |
| 6,394,175 B1 | * | 5/2002 | Chen et al. ................ 165/80.3 |
| 6,404,634 B1 | | 6/2002 | Mann |
| 6,407,916 B1 | * | 6/2002 | Konstad ..................... 361/687 |
| 6,418,018 B1 | * | 7/2002 | Lo ............................. 361/700 |
| 6,480,387 B1 | | 11/2002 | Lee et al. |
| 6,519,149 B1 | * | 2/2003 | Inoue ......................... 361/689 |
| 6,574,101 B2 | | 6/2003 | Tanaka et al. |
| 6,621,698 B2 | * | 9/2003 | Chang ........................ 361/687 |
| 6,643,133 B1 | | 11/2003 | Liu |
| 6,646,880 B1 | | 11/2003 | Liu |
| 6,650,540 B2 | * | 11/2003 | Ishikawa .................... 361/695 |
| 6,654,243 B2 | * | 11/2003 | Sheu .......................... 361/687 |
| 6,704,976 B1 | | 3/2004 | Chen |
| 6,708,754 B2 | | 3/2004 | Wei |
| 2002/0084062 A1 | * | 7/2002 | Chen ..................... 165/104.34 |
| 2003/0005584 A1 | * | 1/2003 | Komatsu et al. ........ 29/890.032 |
| 2003/0183373 A1 | * | 10/2003 | Sarraf et al. .......... 165/104.33 |
| 2004/0052055 A1 | | 3/2004 | Liu |

FOREIGN PATENT DOCUMENTS

| | | | | | |
|---|---|---|---|---|---|
| JP | 2000174188 A | * | 6/2000 | ......... | H01L/23/427 |
| JP | 02000250660 A | * | 9/2000 | ............. | G06F/1/20 |

* cited by examiner

*Primary Examiner*—Michael Datskovskiy
(74) *Attorney, Agent, or Firm*—Fenwick & West LLP

(57) ABSTRACT

A CPU cooling apparatus comprises a fin, a heat sink, and a heat pipe thermally coupling the fin and the heat sink. When installed in a personal computer, the fin thermally couples with a CPU to receive heat generated by the CPU. The heat pipe conducts the heat to a heat sink, which is cooled by an exhaust fan that directs a flow of air outside the computer.

10 Claims, 2 Drawing Sheets

CPU COOLING USING A HEAT PIPE ASSEMBLY

CROSS REFERENCE TO RELATED APPLICATIONS

This application claims the right of priority based on Taiwan application serial no. 091206737, filed on May 13, 2002, which is herein incorporated in its entirety by reference.

BACKGROUND

1. Field of the Invention

The present invention relates generally to cooling a central processing unit (CPU) of a computer.

2. Background of the Invention

Because of its critical role, the CPU of a computer generates a significant amount of heat but must operate at a sufficiently low temperature to avoid degradation in its performance. In the typical personal computer, the CPU is cooled by placing a finned heat sink directly above and in thermal contact with the CPU. A fan is positioned above the heat sink. The fan generates a flow of air immediately above the heat sink, removing the heat generated by the CPU away from an area near the CPU and heat sink, in turn, cooling the surrounding air. Because heat transfer from an object to its environment increases as the temperature of the air surrounding it decreases, this fan helps to keep the CPU cool.

However, since the CPU is typically contained within a computer housing, the heat generated by the CPU and dispersed by the fan does not necessarily escape the computer's housing. Therefore, a second fan is commonly used to blow this heat, as well as the heat generated by the other components inside the computer's housing, outside the housing to the environment. But fans tend to be one of the noisiest, if not the noisiest, components inside a computer. Therefore, the use of this additional fan increases the noise inside the computer. The extra noise is unpleasant for the user, especially when the computer is used for multimedia applications. Also, this additional fan takes up space inside the computer main unit. In small profile computer systems, space is at a premium, so the additional fan is undesirable. Lastly, the fan directly over the CPU may cause vibrations in the CPU, which may affect its performance.

SUMMARY OF THE INVENTION

To solve the above problems, a cooling apparatus for a CPU uses a heat pipe to carry heat generated by the CPU away from the CPU. This heat is then exhausted from the computer by a fan used to blow the heat from the interior of the computer's housing.

In one embodiment of the invention, an apparatus for cooling a CPU comprises a fin adapted to fit over a CPU and conduct heat therefrom, a heat sink for transferring heat to surrounding air, and a heat pipe for conducting heat from the fin to the heat sink. A fan assembly includes a fan configured to direct air through the heat sink and outside of a computer housing. The fan assembly may further include a casing that covers the heat sink and attaches to the computer housing.

In another embodiment, a computer assembly comprises a computer housing for covering a computer's internal components, including a CPU; a CPU socket for receiving a CPU and coupling the CPU to a motherboard inside the computer housing; a fin adapted to fit over a CPU in the CPU socket, the fin for conducting heat generated by a CPU; a heat pipe passing through and attached to the fin, the heat pipe thermally coupled to the fin to carry heat away from the CPU; a heat sink coupled to the heat pipe for conducting heat therefrom and transferring the heat to surrounding air; and a fan assembly mounted to the computer housing, the fan assembly substantially covering the heat sink and configured to direct a flow of air through the heat sink and out of the computer housing.

Accordingly, the cooling apparatus can be attached tightly to the CPU while the fan is attached to the computer's housing, so the vibration of the fan does not affect the performance of the CPU. In addition, while maintaining the ability to cool the CPU sufficiently, embodiments of the invention allow the computer to use a fewer number of fans. Having at least one fewer fan results in less noise, less energy consumed, lower cost, and less space used within the computer's main unit. Because no fan directly above the CPU is required, there are more options for the design of the computer. This is particularly important for computer main units in which small size is desirable.

The novel features of the invention are set forth with particularity in the appended claims. The invention will be best understood from the following description when read in conjunction with the accompanying drawings.

DETAILED DESCRIPTION OF THE PREFERRED EMBODIMENTS

Figure 1:
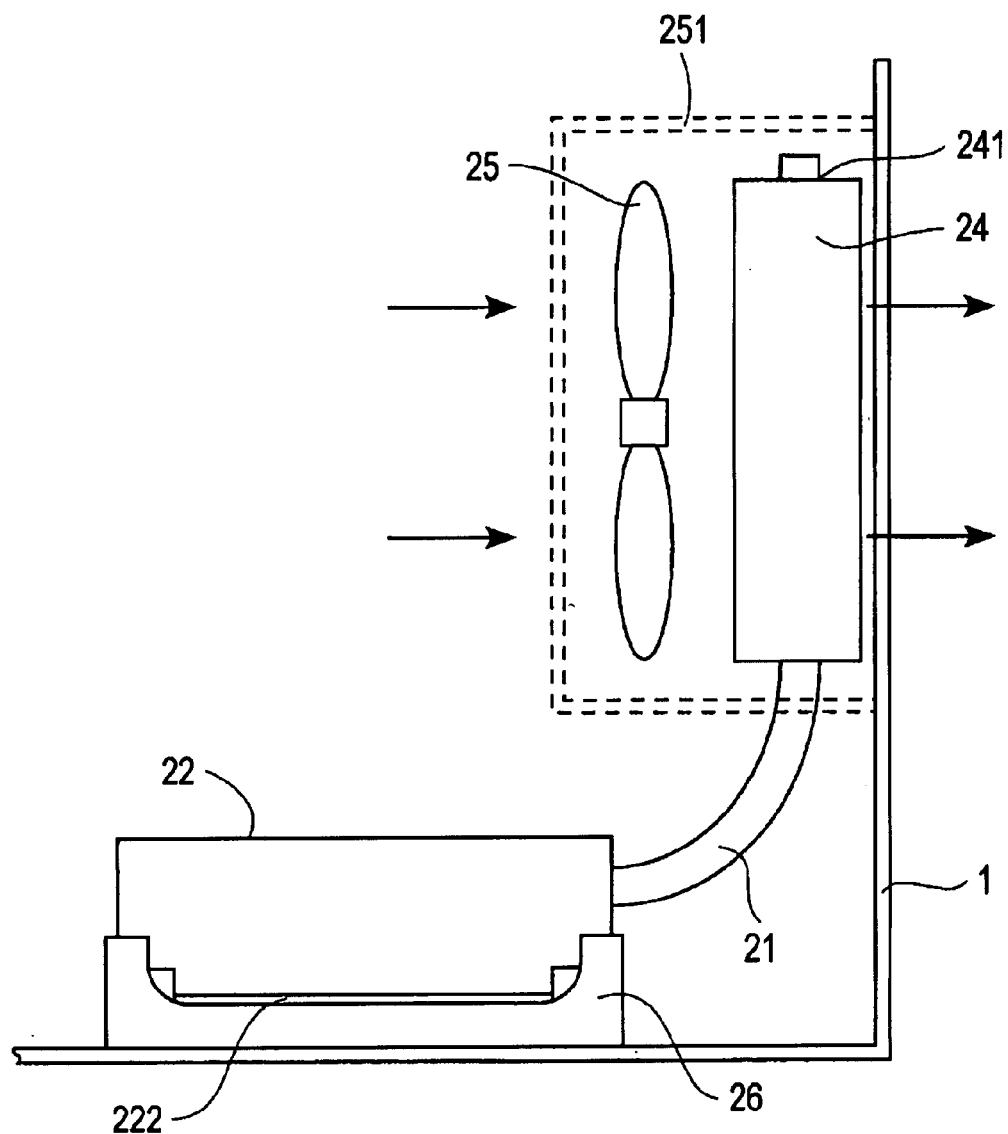
FIG. 1(a) shows a top view of a cooling apparatus in accordance with an embodiment of the present invention.
FIG. 1(b) shows a side view of a cooling apparatus in accordance with an embodiment of the present invention.
FIG. 1(c) shows a rear view of a cooling apparatus in accordance with an embodiment of the present invention.
Figure 2:
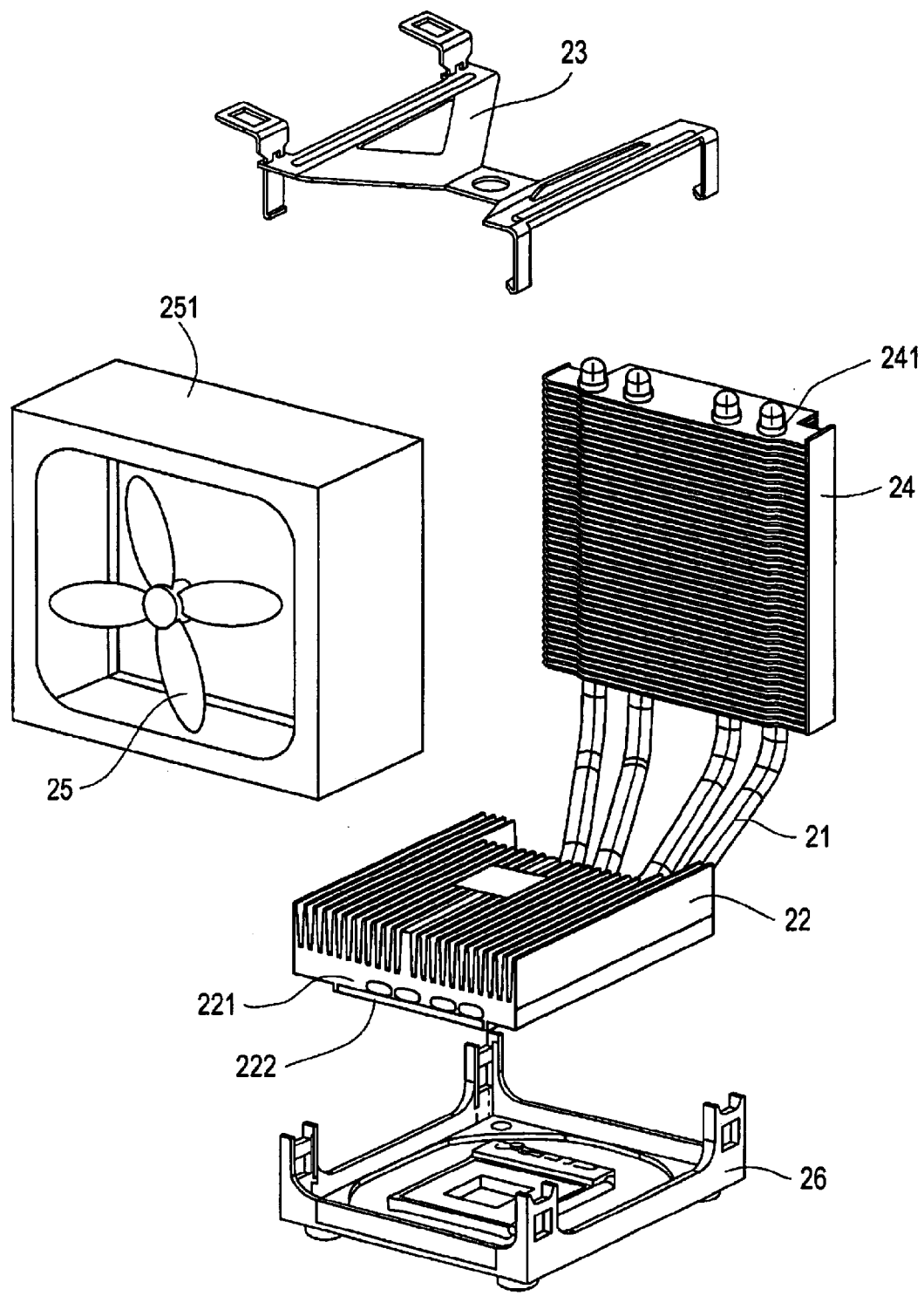
FIG. 2 shows an assembly diagram of a cooling apparatus in accordance with an embodiment of the present invention.

FIGS. 1(a), (b), and (c) respectively show a top view, a side view, and a rear view of a cooling apparatus in accordance with an embodiment of the present invention, and FIG. 2 shows an assembly diagram of the cooling apparatus in accordance with an embodiment of the present invention. The cooling apparatus comprises one or more heat pipes 21, a fin 22, a fastener 23, a plurality of heat sinks 24, and a fan 25. In one embodiment, the cooling apparatus includes four or more heat pipes elements for cooling a CPU.

A fin 22 is placed over a CPU and then fastened to a CPU socket using a fastener 23. The fin 22 has a bottom 221, wherein the bottom 221 of the fin 22 is hollow. A heat pipe 21 passes through the hollow bottom 221 of the fin 22 and bonds to it to make thermal contact therewith. A sheet 222 covers the hollow bottom 221. In one embodiment, the heat pipe 21 has a metal weave interior for effectively conducting heat energy. The heat pipe 21 may also have water or another fluid contained within for conducting heat. The heat pipe 21 leads from the fin 22 to a heat sink 24, which is attached to the heat pipe 21. The heat sink 24 includes a number of openings 241 to allow the heat pipe 21 to pass through the heat sink 24. A fan 25 having a casing 251 covers the exterior of the heat sink 24. At least one screw hole 252 is provided for locking the fan 25 on a housing of the personal computer.

Now taking an example to explain the operation of an embodiment of the invention, the cooling apparatus is installed over a CPU in a computer. The sheet of metal 222 of the fin 22 conducts heat energy generated by the CPU from the CPU to the heat pipe 21. The heat pipe 21 then conducts the heat energy to the heat sink 24. In one embodiment, water in the heat pipe 21 is heated in the area where the heat pipe 21 joins with the fin 22, causing the water to change into vapor and rise. This rising hot water vapor brings heat to the heat sink 24. In one embodiment, the heat pipe 21 includes a metal weave interior to accelerate the heat transfer. Heat from the heat sink 24 it transferred to the air surrounding it, and this hot air is blown out of the computer main unit by the fan 25. As the water vapor in the heat pipe 21 near the heat sink 24 loses heat energy, the water vapor will condense into water and flow back to the part of the heat pipe 21 near the fin 22 to again execute a heat exchange with the heat generated by the CPU and conducted to the sheet of metal 222. In this process, heat generated by the CPU is removed from the housing of the personal computer.

The number of elements for the heat pipe 21 is selected according to the heat dissipation requirements of the system. Generally speaking, a heat pipe 21 in accordance with an embodiment of the present invention can absorb heat at a rate of about 40 Watts. However, because the heat pipe 21 is curved and passes through the heat sink 24, the heat absorption rate of the heat pipe 21 may drop to about 30 Watts.

In one embodiment, the heat sink 24 is made from an aluminum extrusion, each heat sink 24 having at least one opening 241. The number of openings 241 depends on the number of elements of the heat pipe 21, and they overlap each other so as to pass the heat pipe 21 through the heat sink 24.

The fan 25 includes a casing 251, which covers the exterior of the heat sink 24. The casing 251 includes a screw hole 252 or other means to lock the fan 25 on the housing of the personal computer. Typically, the housing of a personal computer is made of metal, which further helps to dissipate heat because heat can be conducted to the housing for increasing thermal conducting efficiency. In one embodiment, the fan 25 is configured to direct an airflow outward from the computer's housing. In this way, the fan 25 carries heat out of the housing but does not carry dust from the atmosphere into the housing.

The foregoing description of the embodiments of the invention has been presented for the purposes of illustration and description. It is not intended to be exhaustive or to limit the invention to the precise forms disclosed. Persons skilled in the relevant art can appreciate that many modifications and variations are possible in light of the above teaching. It is therefore intended that the scope of the invention be limited not by this detailed description, but rather by the claims appended hereto.

I claim:

1. An apparatus for cooling a CPU, comprising:
    a fin adapted to fit over a CPU and conduct heat therefrom, the fin having a hollow bottom and including a sheet of metal covering the hollow bottom;
    a heat sink for transferring heat to surrounding air;
    a heat pipe passing through the hollow bottom of the fin and attached to the fin, the heat pipe thermally coupling the fin to the heat sink to facilitate the transfer of heat from the fin to the heat sink; and
    a fan assembly including a fan configured to direct air through the heat sink and outside of a computer housing.

2. The apparatus of claim 1, wherein the fan assembly includes a casing that covers the fan and the heat sink.

3. The apparatus of claim 2, wherein the casing of the fan assembly is attachable to a computer housing.

4. The apparatus of claim 1, further comprising:
    a fastener for securing the fin to a CPU by directly pressing the fin against the CPU.

5. The apparatus of claim 1, wherein the heat pipe includes a metal weave interior for conducting heat.

6. The apparatus of claim 1, wherein the heat pipe is curved so that the fin and the heat sink are substantially perpendicular with respect to each other.

7. The apparatus of claim 1, wherein the fan is configured to direct air outward from the computer housing.

8. A computer assembly comprising:
    a computer housing for covering a computer's internal components, including a CPU;
    a CPU socket for receiving a CPU and coupling the CPU to a motherboard inside the computer housing;
    a fin adapted to fit over a CPU in the CPU socket, the fin for conducting heat generated by a CPU, the fin having a hollow bottom and a metal covering over the hollow bottom, the metal covering for contacting with a CPU in the CPU socket and conducting heat energy generated by the CPU;
    a heat pipe passing through the hollow bottom of the fin and attached to the fin, the heat pipe thermally coupled to the fin to carry heat away from the CPU;
    a heat sink coupled to the heat pipe for conducting heat therefrom and transferring the heat to surrounding air; and
    a fan assembly mounted to the computer housing, the fan assembly substantially covering the heat sink and configured to direct a flow of air through the heat sink and out of the computer housing.

9. The computer assembly of claim 8, further comprising a fastener to secure the fin to the CPU socket, wherein there is no fan directly over the fin.

10. The computer assembly of claim 8, wherein the heat pipe is curved so that the fin and the heat sink are substantially perpendicular with respect to each other.

* * * * *